(12) United States Patent
Pham

(10) Patent No.: US 6,313,988 B1
(45) Date of Patent: Nov. 6, 2001

(54) SERVER WITH REDUCED SPACE REQUIREMENT

(75) Inventor: Long Thanh Pham, Berkeley, CA (US)

(73) Assignee: Hong T. Ha, Alameda, CA (US)

( * ) Notice: Subject to any disclaimer, the term of this patent is extended or adjusted under 35 U.S.C. 154(b) by 0 days.

(21) Appl. No.: 09/407,706

(22) Filed: Sep. 28, 1999

(51) Int. Cl.$^7$ .................................................. G05F 1/16
(52) U.S. Cl. ........................ 361/687; 361/688; 361/689; 361/690; 361/691; 361/692; 361/693; 361/694; 361/695
(58) Field of Search ...................... 361/687–695

(56) References Cited

U.S. PATENT DOCUMENTS

| | | | |
|---|---|---|---|
| 5,224,024 | 6/1993 | Tu et al. | 364/429 |
| 5,460,441 | 10/1995 | Hastings et al. | 312/298 |
| 5,596,483 | 1/1997 | Wyler | 361/683 |
| 5,912,799 | 6/1999 | Grouell | 361/685 |
| 5,963,424 | * 10/1999 | Hileman et al. | 361/695 |

* cited by examiner

Primary Examiner—Leo P. Picard
Assistant Examiner—Yean-Hsi Chang
(74) Attorney, Agent, or Firm—Robert Samuel Smith

(57) ABSTRACT

A computer for a server or work station which has two air cooling streams one stream leads from outside the chassis across the motherboard and through a vented power supply then directly into the environment and is driven by a fan inside the power supply. This air stream independently and directly removes the major source of heat which is the power supply. The second air stream circulates from outside the chassis through the hard drives and out of openings adjacent the hard drives and is driven by fans positioned between the hard drives and vented openings in the chassis. The efficient heat removal is compatible with an arrangement of components in the chassis such that the overall height is less than 3½. The reduced height and efficient heat removal make the computer ideally suited for mounting in a server chassis with other servers where close spacing is desired.

12 Claims, 5 Drawing Sheets

SERVER WITH REDUCED SPACE REQUIREMENT

FIELD OF THE INVENTION

This invention relates to servers and particularly to a server occupying reduced space accomplished by arrangement of components to enhance heat dissipation capability.

PRIOR ART AND INFORMATION DISCLOSURE

In the context of this specification, a server computer is understood to mean a computer that stores files that can be accessed through a network or over the Internet. The role of the server on the Internet is illustrated by the schematic block diagram shown in FIG. 1. For illustrative purposes, the Internet shown in FIG. 1 has four "server computers" (or hosts) 10. Each server computer 10 is connected to its own network of of three "clients 12" (computers) and to other server computers. Each server computer 10 can communicate with any other server computer 10 either directly or indirectly through other server computers. Connection of a server computer 10 to local clients 12 of its network is typically by telephone lines (twisted wire pair or optical cable). Connection between hosts is either by telephone or broadcast by satellite.

A client can also perform as a source of data to be transmitted through the network of server computers to another client.

Anyone of the server computers can provide one or more of a list of services to its network of clients. Each service, provided by a given server computer, has stored a program in the server computer corresponding to the service. Examples of the service and corresponding program may be any one or more of:

email;

search engine, a program whereby a client can search for files by category;

browser, whereby a client can search for files by keyword.

For example, in FIG. 1, the e-mail program is stored in server computers 10, (I, II, III) so that e mail can be sent between any clients, 12 A,B,C of server computers I, II, III. connected to the respective server computers. Therefore, e-mail can be sent between all of the clients of servers I, II, III but not server IV.

A browser program is stored in each of servers II, III, IV. Therefore, all of the clients of computer servers II, III, IV, can use keywords stored in the browser program to search for documents having these keywords originating in the clients of server computers II, III, IV.

A search engine program is stored in each of server computers I, III, IV. Therefore, all of the clients of server computers I, III, IV, can use keywords stored in the search program to search for documents listed under document headings stored in the search engine programs in servers I, III, IV.

The server industry is organized by companies (service providers), wherein each service provider has one or more server computers. A set of programs, that is unique for the service provider, is generally stored in each of its server computers.

As service providers extend the geographical boundaries of their business by installing additional server computers in various locations, the boundary of one service provider overlaps the boundary of a competing service provider. Furthermore, the physical size of each server computer at any one location is small. Therefore, the practice has been in the industry to locate the server computers from all of the service providers in a given locale in one room. The room is maintained by a "landlord" and each of the service providers rent space in the room for its server computer. Well established "server landlords" include the GLOBAL CENTER located in San Jose, Calif. and the LEVEL TREE located in San Francisco, Calif.

This arrangement has at least two advantages. Firstly, the cost to each service provider of maintaining a facility for its server computer in a given locale is reduced. Secondly, communications between server computers of different service providers is simplified, requiring only a short coaxial connection.

As the customer base of a service provider in a given area increases, the number of server computers required by the service provider to service that area increases. Furthermore, new service providers appear in the location. Consequently, the demand for space in the server room intensifies and the rent is increased accordingly. The demand is so intense that space in the room is rented by the square inch of rack space on which the server computer is mounted.

FIG. 2 (prior art) shows the arrangement of servers in a server room. There are shown a pair of vertical columns 14 separated by a space 16 which is set by industry standard to be 18 inches so that the chassis of a "standard" server computer can have each end of its front panel 18 bolted to one of the columns 14. The height 15 of the standard chassis for the server computer according to the present state of the art is 4½ inches. A service provider pays rent to the landlord based on the area of the front panel of his server (18"×4½").

FIG. 3 shows a plan layout of of components in the chassis of the server computer according to the present art. The chassis 11 is 18" wide to fit between the columns 14 and the height 15 is 4½". The front panel 18 is bolted at each end to a vertical column. There is shown a power supply 22 in the corner formed by the front panel 18 joined to the left side panel 19 . A fan 28 for cooling the entire contents of the server computer is typically located in the front panel 18, A floppy disk 24 is mounted over a CD-Rom (not shown) in the corner formed by the front panel 18 joining the right side panel 21. A stack 26 of one or more hard disk drives is positioned in the corner formed by the right side panel 21 meeting the rear panel 23. A mother board 25 with daughter boards and a cpu is mounted in the corner formed by the left side panel 19 meeting the rear panel 23 . The length of the chassis of the server computer 11 from front panel 18 to rear panel 23 is typically 22 inches.

Variations from this "typical" arrangement are disclosed in the patent literature.

U.S. Pat. No. 5,224,024 to Tu et al. discloses a retaining frame for components of a personal computer.

U.S. Pat. No. 5,694,290 to Chang et al discloses a replaceable hard disk drive box structure with a built in fan.

U.S. Pat. No. 5,912,799 to Grouell et al discloses a multiple disk drive storage enclosure with ventilation in which a power supply has fans that pull an air stream in through vents in the front panel, across a stack of hard drives, through the power supply, then out of vents in the rear panel. This construction inherently does not have the low elevation characteristic that is an object of the present invention.

A major factor in dictating the density of components mounted on a chassis is the upper limit of temperature that can be tolerated. Rise in temperature of the components in use is by far the most important factor in establishing the useful life of the server. Each of the components in FIG. 3 generates heat that must be dissipated. The power supply 22 generates the most heat (about 250 watts) and can operate continuously up to a temperature of about about 90° F. The stack of hard drive disks 26 is the most heat sensitive component and develops problems at about 60° C.

In an attempt to overcome the deleterious effects of heat, a single fan 28 is traditionally positioned as shown in FIG. 3 between the power supply 22 and floppy disk 24 and the cooling air stream is driven by the fan 28 out of a grated opening 30 (see FIG. 2) in the front panel 18.

U.S. Pat. No. 5,596,483 to Wyler discloses an air cooled computer featuring a power supply that acts like a chimney with vents in a top panel and side panel such that heat generated in the power supply rises through the vents in the top panel drawing air across neighboring circuit boards through the vents in the side panel. This construction defeats the purpose of the present invention which is to provide a server computer that operates efficiently as one of a closely packed stack of computers.

U.S. Pat. No. 5,684,671 to Hobbs et al discloses a rack mounted data server in which like components (disk drives, card cages, etc.) are all stacked together. this structure defeats the object of the present invention which is to have a stack of complete servers independent of one another.

U.S. Pat. No. 5,460,441 to Hastings et al discloses a rack mounted computer system including a vertically elongated cabinet in which a stack of servers are mounted. Each server unit is cooled by a single air current generated by a pair of fans that draws air in through side vents across a a hard disk drive and entirely enclosed power supply. This arrangement for removal of heat is not nearly as effective in removing heat as the present invention as will be made clear in the following description of the invention.

The first server computers had a height of 4 "U". The "U" is a unit of measure arising out of the height of the early power supplies and is equal to 1.6 inches. The height (number of "U"s) of the state of the art chassis has been dictated by the tradition of vertically stacking the hard disk drives and the arrangement of components shown in FIG. 3. Increasing the number of hard disk drives, of course, increases the memory capacity of the server but it also requires increasing the height of the server computer according to the practices of the prior art (FIG. 3).

There is an urgent demand for a server computer operating in the present server computer environment and occupying reduced rack space in order to reduce the burdensome rent charged for rack space.

The number of server computers to be mounted in the "landlord" room is increasing at a precipitous rate.

As the demand for more rack area has increased, the rent of rack area has also increased so that, in present circumstances, the cost of renting rack space has become a significant factor in the overall cost of doing business.

SUMMARY OF THE INVENTION

It is an object of this invention to provide a server computer that can be installed on a server rack in an Internet server room having the same components that are found in present typical server computers used on the Internet.

It is another object that the server has a substantially lower height than server computers of the current art thereby providing that the the overall "rack area" required for the sever computer is reduced where "rack area" is the area of the front panel of the server computer. It is a particular object that the height be no greater than one "2U" (3.5 inches) and that the front panel of the server computer have the standard length for server computers of 19 inches.

It is a further object that the server computer dissipate heat generated by use of the server computer to an extent that it performs according to requirements even when installed and operating on a server rack in close proximity to other server computers on the same rack.

This invention is directed toward a server computer having the usual components found in traditional server computer (being a power supply, hard disk drive, floppy disk, CD-Rom memory storage and a mother board with daughter boards and a central processing unit). The server computer of this invention includes an array of fans operably arranged in combination with a unique arrangement of the components, such that operating temperature of the server is maintained below an acceptable limit in spite of close proximity to the neighboring server computers above and below the server.

According to the invention, the hard disk drives are not arranged in a stack as in the traditional arrangement but are positioned alongside one another, in a corner of the chassis formed by the front panel and a (first) side panel. Each hard disk drive has its own fan placed between a grating in the front panel and the respective hard disk drive. Each fan pumps air directly out of the respective hard disk drive through its own (open) grating in the front panel. Since each hard disk drive generates 15–20 watts in operation, the presence of a fan for each disk drive pumping the heated air into open space as soon as the heat is generated is a major factor in maintaining the respective hard disk file below the maximally tolerable upper temperature limit of 60° C.

A floppy disk and/or a CD-ROM (disk) is located in the corner of the chassis defined by the front panel and the opposite side panel. The floppy disk is positioned over the floppy disk and is accessible for replacement through an opening in the front panel. The floppy and CD-ROM only generate 5 watts of power so that instant dissipation of heat is not so critical with these devices as with the Hard disk drives.

The mother board is located in the corner formed by the first side panel and the rear panel.

The invention also features a power supply that is uniquely designed to fit into the corner of the chassis formed by the rear panel and the opposite side panel. The unique feature of the power supply is a chassis that has a reduced height (3 inches), and width (4.5 inches) that permits locating the power supply between the (second) side panel and the mother board. The required volume for the components inside the power supply chassis is provided by a length of the power supply chassis which is 6.5 inches so that the total volume of 6.5×4.5×3 cubic inches of the power supply chassis is sufficient for containing all of the power supply components.

A side of the power supply is in thermal contact with the left side of the server chassis which aides in dissipating the heat generated by the power supply by simple conduction through the side of the power supply and the second side panel of the server chassis.

A rear side of the power supply abuts the rear panel of the server chassis. A fan is mounted inside the power supply and on the rear side of the power supply. The fan faces an opening in the rear sides of the server chassis and the power supply. One grating is formed in the side of the power supply chassis facing the mother board and another grating is formed in the rear panel of the server chassis facing the mother board. The fan in the power supply therefore generates an air stream that passes:

from the environment around the server computer and through one opening in the rear panel of the chassis of the server computer;

passes over (and cools) the mother board and daughter boards;

passes through the grating in the long side of the power supply;

passes over and draws heat from the components in the power supply;

passes through the fan in the power supply; and finally passes out through the grating that covers the opening in the power supply and rear panel of the server chassis.

This ventilating arrangement is effective in dissipating the heat (250–450 watts) generated by the power supply thereby maintaining the power supply below 90° C. which is the limit of temperature that can be tolerated by the power supply.

The arrangement whereby cooling air is forced directly from the outside over the mother board also maintains the mother board in an acceptable range of temperature.

DESCRIPTION OF A BEST MODE

Figure 4:
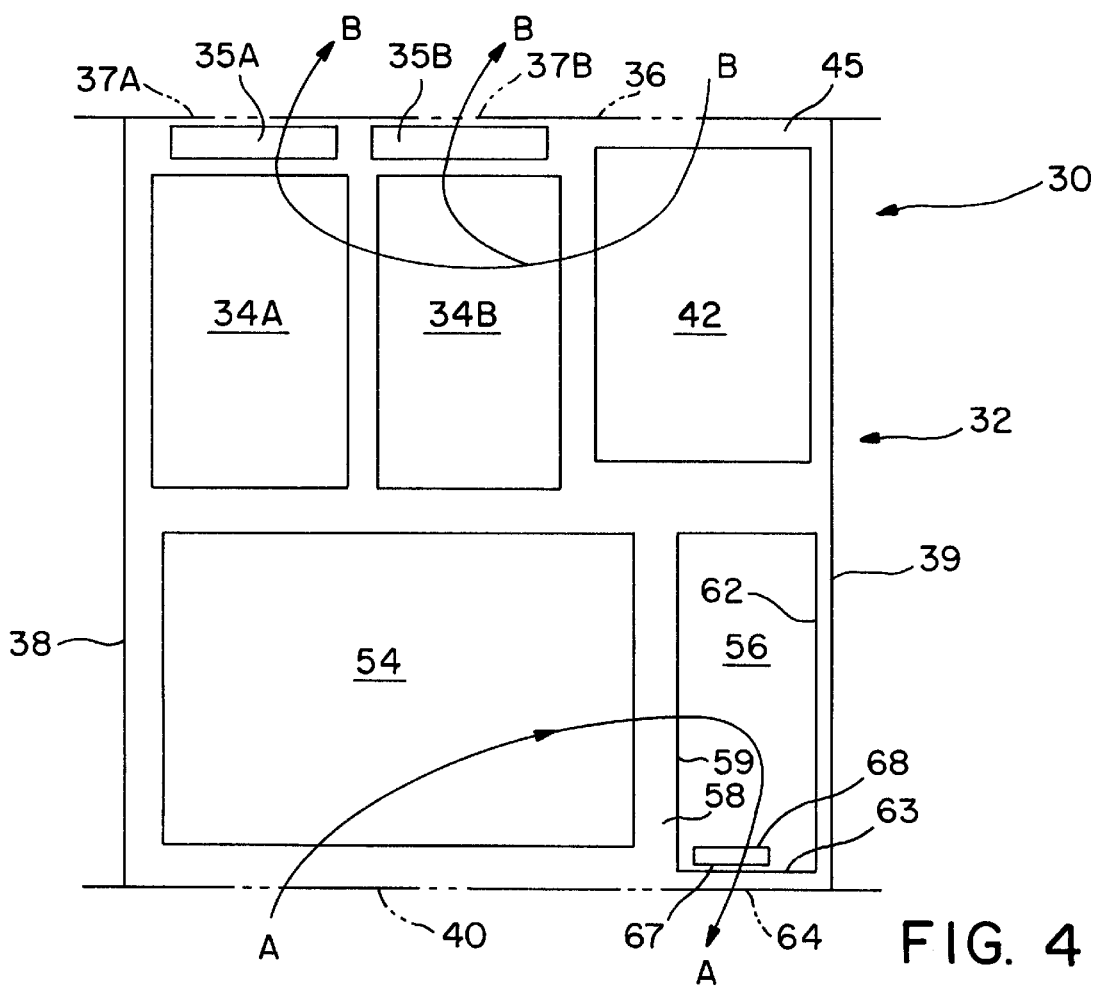
FIG. 4 shows the arrangement of the computer of this invention.

Turning now to a description of the drawings, FIG. 4 shows a plan view of the computer 30 of this invention illustrating the arrangement of the components for maximum effectiveness in dissipating heat. leading to a reduction in height. The computer 30 is the type that can be used as a server computer on the internet.

Figure 1:
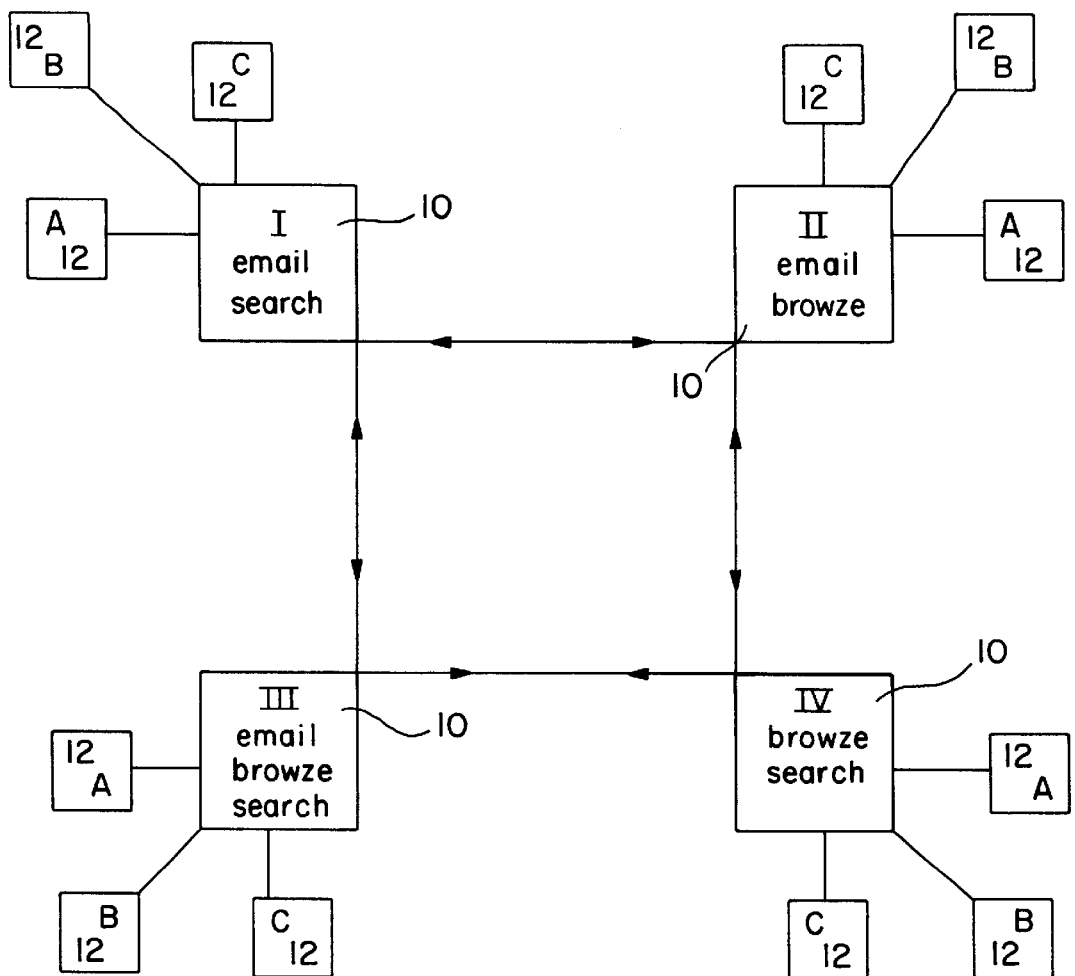
FIG. 1 illustrates the Internet according to the prior art.
Figure 2:
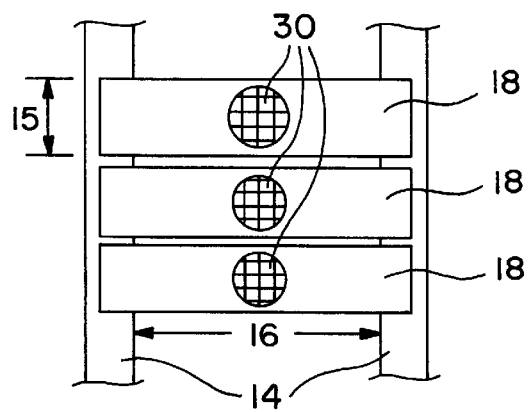
FIG. 2 shows server computers mounted on a rack according to the prior art.
Figure 3:
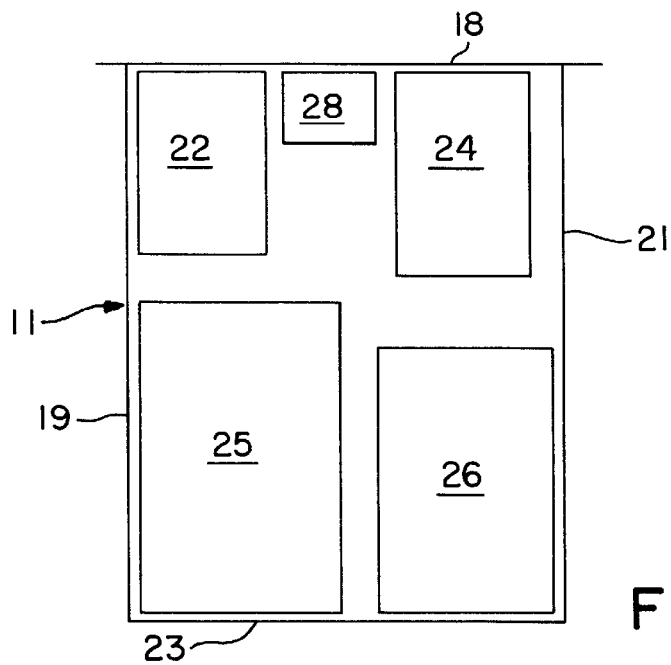
FIG. 3 shows the arrangement of an array of server computers according to the prior art.

There is shown a computer chassis 32. The computer chassis 32 has a front panel 36 shown also in FIG. 5. The front panel 36 has a "standard" length of 19 inches with two pairs apertures 43A, B. One pair of apertures 43A in one end opposite the other pair 43B in the opposite end of the front panel The server chassis 32 also has a right side panel 39 and a left side panel 38. Each right and left side panel has one end joined perpendicularly to the front panel 36 and another end joined perpendicularly to a rear panel 40. The height of the front panel 36, the rear panel 40, right panel 39 and left side panel 38 is no more than 3 5/16 inches. The right side panel 39R is spaced a distance of 17 inches from the left side panel 39L. The length of the front panel 36 and positioning of the apertures 37 in the front panel 16 and the spacing between the right and left side panels enable the server 30 to be mounted snugly between the uprights of a server rack with fasteners through the apertures 37 securing the front panel to the uprights as shown in FIG. 2.

A hard disk drive 34A is positioned in the corner formed by the front panel 36 and the and the left side panel 38. A second hard disk drive 34B is positioned next to hard disk drive 34A and proximal to the front panel 36. A pair of fans is shown with one of the fans 35A interposed between hard disk drive 34A and a vented opening 37A in front panel 36. In the context of this specification, a vented opening is defined as meaning an array of apertures in the panel such as the honey comb array 37A,B shown in FIG. 6 which provides a passageway for an air stream to pass from one side of the panel to an opposite side.

The other fan 35B is interposed between between hard disk drive 14B and and a vented opening 37B in front panel 36. Fans 35A,B have an overall height and width of no more than three inches and a depth of about one inch. Height of the fans is measured in the direction vertical to the base panel 39 of the server chassis 32. Depth of the fans 35A,B is the dimension measured perpendicular to the front panel 36 and is essentially the spacing between the front panel and the respective hard disk drive.

Each fan 35A,B preferably operates with no more than 12 volts at 2.6 watts such as fans manufactured by Sunon, Taiwan. having the required dimensions.

A floppy drive 42 mounted over a CD Rom (not shown) is positioned in corner formed by the front panel 36 and the right side panel 39. In another embodiment, the floppy drive 42 is mounted over a hard disk drive.

Figure 5:
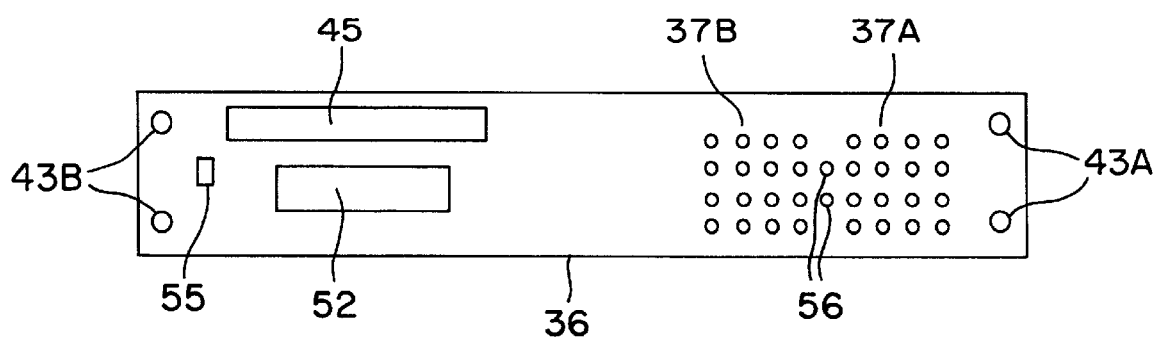
FIG. 5 shows the front panel of the computer of this invention.

FIG. 5 shows the front panel 36 with a vented opening 37A for fan 35A and a vented opening 37B for fan 35B. An opening 45 for providing access to the floppy drive 42 and an opening 52 for providing access to the CD Rom. In addition, a power switch with LED 55 and an LED 57 for each hard disk are shown.

Referring again to FIG. 4, a mother board 54 is shown mounted in the corner of the chassis formed by the left side panel 38 and the rear panel 40.

Figure 7:
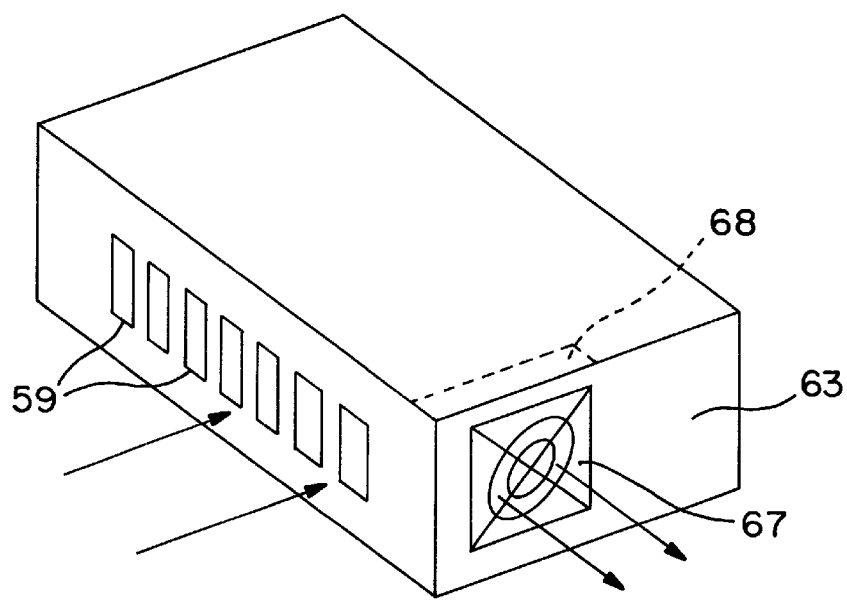
FIG. 7 shows the power supply chassis with circulating air stream.

A power supply 56, is shown having outer dimensions selected to fit between the mother board 54 and the right side panel 39 in accordance with the object of the invention to maximize heat dissipation. An important requirement is that the the power supply 56 be positioned with one side 58 having a vented opening 59 and facing the mother board 54, an opposite side 62 abutting the right side panel 39 of the server chassis, and a rear side 63 with another vented opening 67 adjacent a vented opening 65 in rear panel 40 of the computer chassis 32. Details of the power supply chassis are shown in FIG. 7

The power supply must be no wider than 4½ inches (measured parallel to the base panel) in order to fit between the motherboard and the server left panel. Heat generated inside the power supply is partially dissipated by conduction through the side of the power supply in thermal contact with the left side panel of the server chassis and into the outside environment.

FIG. 5 shows the side of the power supply chassis facing the mother board having a vented opening extending over most of the full length of its side.

Figure 6:
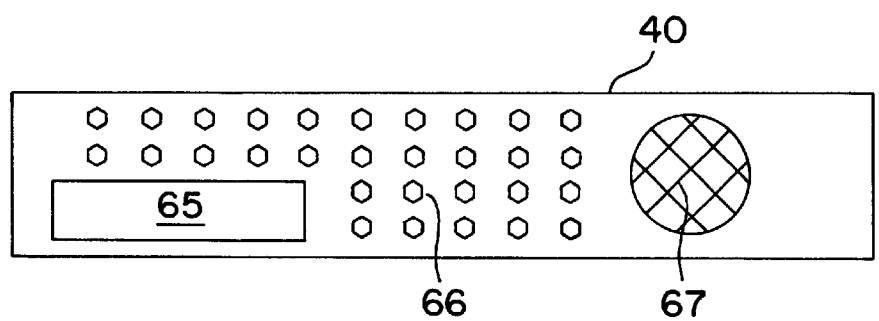
FIG. 6 shows the rear panel of the computer of this invention.

FIG. 6 shows to better advantage a plan view of the rear panel 40 of the computer chassis in accordance with the invention. There are shown an opening 65 for access of conductors to the mother and daughter boards, a vented opening 66 overlooking the mother board 54 and another opening with grating 67 communicating with an opening 64 (see FIG. 4) in a side of the power supply 56. A fan 68 is mounted inside the power supply 56 for sending an air stream through the the second grating 64.

Air streams generated by the fans in operable arrangement with the vented openings are illustrated by the arrows A and B in FIG. 4.

One course of air stream is generated by fan 68 in the power supply 56 which draws air in through vented opening 66 across the mother board 54, through vented opening 59 across the inside of the power supply 56, and is expelled by the fan 68 through the vented opening 67 in the power supply 57 and out vented opening 64 in rear panel 40 to the environment outside the computer.

The second course (arrow B is generated by the fans 35A,B which draw air through the access openings 45 for floppy and CD Rom drives 42 across the respective hard disk drives 34A,B and expel the air directly into the surrounding environment.

These two air streams are effective in maintaining the operating temperature of the power supply, which generates 250–450 watts below 90° C. and the hard disk drives below 60° C.

The arrangement whereby cooling air is forced directly from the outside over the mother board also maintains the mother board in an acceptable range of temperature.

A major feature of the invention is that two cooling air streams are provided. One stream cools the power supply and mother board. The other stream cools the hard drives. The division of air streams provides that each air stream is short and broad so that the overall impedance to air flow is reduced. Separation of the air stream for cooling the power supply from the air stream that cools the disk drives operates to more efficient cooling of both components. The feature of directly expelling the heat from inside of the power supply to the environment greatly increases effectiveness of heat removal from the system since the power supply is the major source of heat. Protection of the heat sensitive hard drives is enhanced.

The efficient expulsion of heat makes possible another major feature of the invention which is that the server of this invention may may be no more than 3½ inches high. and can be sandwiched between two other servers mounted on a rack since heat is expelled out of the vertical sides of the server rather than through the top or bottom. The computer is therefore especially adaptable for use as a server computer where compactness of a vertical array of computers is a valuable characteristic since a considerable reduction in rent for server space on the rack is thereby effected.

Variations and modifications may be contemplated after reading the specification and studying the drawings that are within the scope of the invention.

For example, it will be understood that the architecture described above is especially applicable to a close packed stack of computers serving the internet, the features may also be applied to construction of computers for other purposes such as for work stations.

Figure 8:
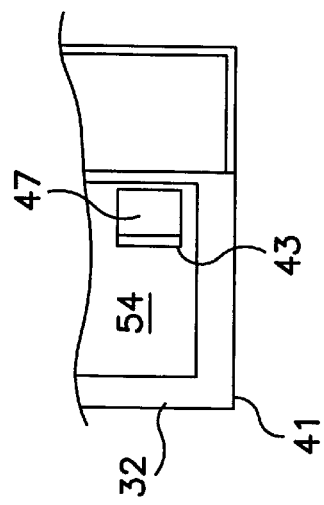
FIG. 8 is a cutawy top view showing the chassis with riser cards.

FIG. 8 shows another embodiment for accommodating additional modules (cards) that are longer than the height of the chassis.

Figure 9:
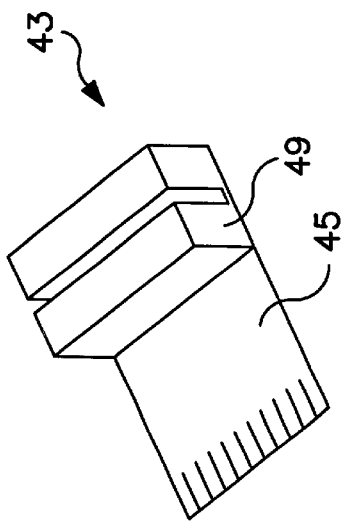
FIG. 9 is a perspective view of a riser card.

FIG. 8 is a partial top view of the chassis 32 showing the mother board 54 next to the power supply 56 and a back panel 41 according to this embodiment. A riser card 43 is mounted on the mother board 54 and is shown to better advantage separately in FIG. 9.

Figure 10:
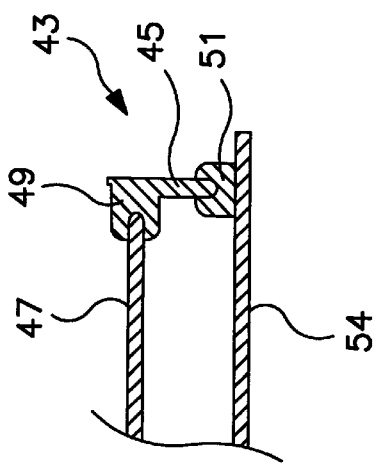
FIG. 10 is a sectional view of a card module plugged into a riser card mounted on the mother board.

The riser card 43 includes a module card receptacle (block) 49 mounted on a terminal board 45. FIG. 10 is a sectional view showing a module card 47 plugged into the riser card 43 and the riser card 43 plugged into a receptacle 51 on the mother board 54.

Figure 11:
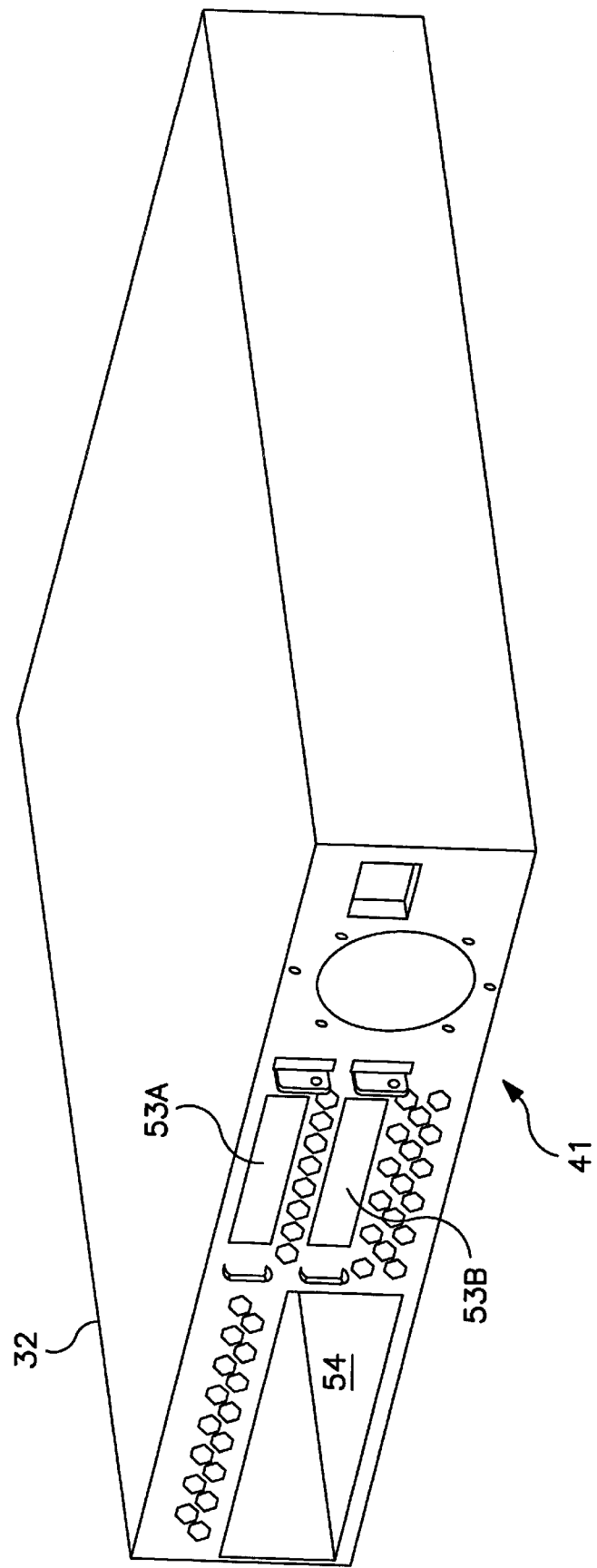
FIG. 11 shows the rear panel with slots for plugging module cards into the riser cards.

FIG. 11 is a view of the back panel 41 with a slot 53 in the back panel to permit inserting two module cards (FIG. 12) through either slot 53A or 53B and plugging into the riser card 43 secured on the mother board 54 inside the chassis 32.

Two slots 53 A, B are shown in FIG. 11 In some applications only one slot is required.

Figure 12:
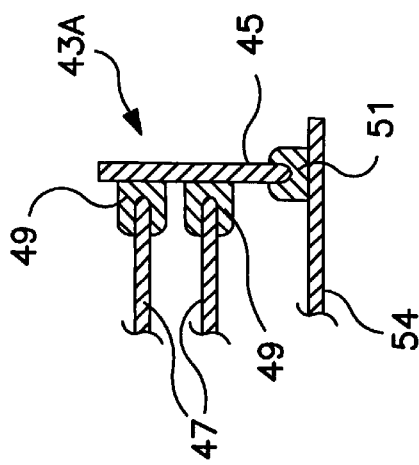
FIG. 12 is a sectional view showing two module cards plugged into a single riser card.

FIG. 12 is a sectional view of a riser card 43A showing a double row of connections 49A for plugging in two module cards 47.

FIG. 8 shows the riser card mounted a distance equal at least to the length of slot 53 from the power supply 56 in order to not interfere with the flow of air current discussed above. While this is the preferred arrangement for most situations, it will be understood that positioning the riser card on the other end of the slot (closer to the power supply may be required for some situations.

Various arrangement of the components of the invention include:

location of the components as described;

a mirror image of the components about a plane through the center line of the front and rear panels and perpendicular to the base panel;

a mirror image of the components about a plane through the center line of the side panels and perpendicular to the base panel;

a 180° rotation about a center line perpendicular to the base panel. so that, the hard disk drives and floppy disk drives are adjacent the rear panel and the mother board and power supply are adjacent the front panels. This latter arrangement can be described equivalently by having the rear panel being nineteen inches long with one inch extensions on either end so that the rear panel is fastened to the vertical standards.

In view of these permutaion of positions which are within the scope of the invention, it will be understood in the context of this specification for the purpose of including the scope of the claims that, in one permutation and referring to FIG. 4, right side panel 39 corresponds to first side panel, left side panel corresponds to second side panel. The front panel and first side panel corner form a first corner 39'A, the front panel and the second side corner form a second corner 39B, the rear panel and first side panel form a third corner 39C, and the rear panel and said second side panel forming a fourth corner 39D.

In view of these variations, it is therefore wished to define the scope of the invention by the appended claims.

What is claimed is:

1. A computer comprising:

a computer chassis having a front panel, a first side panel, opposite a second side panel and a rear panel all mounted on a base panel to form a rectangular enclosure:

said front panel and said first side panel corner forming a first corner, said front panel and said second side corner forming a second corner, said rear panel and said first side panel forming a third corner, and said rear panel and said second side panel forming a fourth corner, said front panel, first and second side panels and rear panel all having a height less than three and one half inches providing that said enclosure has a height less than three and one half inches measured perpendicular to said base panel;

said front panel having a length of nineteen inches;

said first and second side panels each having a length of twenty two inches said first and second side panels being parallel to one another and separated by a space of seventeen inches;

said first and second side panels each joined perpendicularly to said front panel at a distance of one inch from respective ends of said front panel providing that a one inch length of said front panel extends beyond said first side panel and another one inch length of said front panel extends beyond said second side panel;

said one inch length and said another one inch length of said front panel extending beyond said first and second side panels respectively each having at least one aperture arranged to enable positioning said computer chassis between two uprights separated by eighteen inches and securing said computer chassis to said uprights by fasteners through said apertures into said uprights;

said front panel having a first vented opening positioned proximal to said first corner, and a second vented opening proximal to said first vented opening and an opening for accessing a floppy disk drive;

said opening for accessing a floppy disk drive positioned between said second vented opening and said second corner;

said rear panel having an opening for a fan grating proximal to said fourth corner, and a vented opening, and an opening for accessing a mother board and plurality of daughter boards;

said opening for accessing a mother board and plurality of daughter boards next to said third corner of said computer chassis;

a first fan positioned next to said front panel and said first side panel and positioned to direct an air steam through said first vented opening in said front panel;

a first hard disk drive positioned next to said first fan and said first side panel and arranged in operable combination with said first fan to enable said first fan to expel said air stream heated by said first disk through said first vented opening to environment outside said computer;

a second fan positioned next to said front panel and said first fan and positioned to direct an air stream through said second vented opening in said front panel;

a second hard disk drive positioned next to said second fan and said first hard disk drive and arranged in operable combination with said second fan to enable said second fan to expel air heated by said second hard disk drive through said second vented opening to outside said computer;

a floppy disk drive positioned next to said second hard disk drive and said front panel adjacent said floppy disk opening arranged in operable combination with said floppy disk opening to provide access to said floppy disk drive through said floppy disk opening;

a power supply chassis containing a power supply and positioned in said fourth corner of said computer chassis;

said power supply chassis having a first side, a second side and a third side with an edge of said first side joined perpendicularly to an edge of said second side opposite said third side;

said third side positioned against said second side panel providing that a portion of heat generated inside said power supply is thermally conducted through said third side and said second side panel of said computer chassis to said environment;

said first side having an opening;

said second side having a vented opening;

a third fan having an open grate and mounted in said power supply and arranged in operable combination with said opening in said first side and said opening for a fan grating in said rear panel to enable said third fan to generate an air stream circulating from an environment outsides said server, through said vented opening in said rear panel, then across said mother board and daughter boards, then through said vented opening in said second side into said power supply, then through said opening in said first side, and through said open grate of said third fan, and through said opening in said rear panel proximal to said corner of said fourth corner of said server chassis into said environment.

2. The computer of claim 1 wherein said front panel further comprises:

another opening for accessing one of
(i) a CD-Rom drive;
(ii) a third hard drive;

said another opening positioned between said opening for said floppy disk and an elongated edge of said front panel.

3. A computer comprising:

a computer chassis having a front panel, a first side panel, opposite a second side panel and a rear panel all mounted on a base panel to form a rectangular enclosure;

said front panel and said first side panel corner forming a first corner, said front panel and said second side corner forming a second corner, said rear panel and said first side panel forming a third corner, and said rear panel and said second side panel forming a fourth corner;

said front panel having a first vented opening positioned proximal to said first corner, and a second vented opening proximal to said first vented opening and an opening for accessing a floppy disk drive;

said opening for accessing a floppy disk drive positioned between said second vented opening and said second corner;

a first fan positioned next to said front panel and said first side panel and arranged to direct an air stream through said first vented opening in said front panel;

a first hard disk drive positioned next to said first fan and said first side panel and arranged in operable combination with said first fan to enable said first fan to expel air heated by said first hard disk through said first vented opening to environment outside said server;

a second fan positioned next to said front panel and said first fan and arranged to direct an air stream through said second vented opening in said front panel;

a second hard disk drive positioned next to said second fan and said first hard disk drive and arranged in operable combination with said second fan to enable said second fan to expel air heated by said second hard disk drive through said second vented opening to outside said computer;

a floppy disk drive positioned next to said second hard disk chive and said front panel adjacent said floppy disk opening arranged in operable combination with said floppy disk opening to provide access to said floppy disk drive through said floppy disk opening;

a power supply chassis containing a power supply and positioned in said fourth corner of said computer chassis;

a mother board positioned in said third corner of said computer chassis.

4. The computer of claim 3 further comprising said front panel, first and second side panels and rear panel all having a height less than three and one half inches providing that said enclosure has a height less than three and one half inches measured perpendicular to said base panel.

5. The computer of claim 3 further comprising:

said front panel having a length of nineteen inches;

said first and second side panels each having a length of twenty two inches said first and second side panels being parallel to one another and separated by a space of seventeen inches;

said first and second side panels each joined perpendicularly to said front panel at a distance of one inch from respective ends of said front panel providing that a one inch length of said front panel extends beyond said first side panel and another one inch length of said front panel extends beyond said second side panel;

said one inch length and said another one inch length of said front panel extending beyond said first and second side panels respectively each having at least one aperture arranged to enable positioning said server chassis between two uprights separated by eighteen inches and securing said server chassis to said uprights by fasteners through said apertures into said uprights.

6. The computer of claim 3 further comprising:

said rear panel having a length of nineteen inches;

said first and second side panels each having a length of twenty two inches said first and second side panels being parallel to one another and separated by a space of seventeen inches;

said first and second side panels each joined perpendicularly to said rear panel at a distance of one inch from respective ends of said rear panel providing that a one inch length of said rear panel extends beyond said first side panel and another one inch length of said rear panel extends beyond said second side panel;

said one inch length and said another one inch length of said rear panel extending beyond said first and second side panels respectively each having at least one aperture arranged to enable positioning said computer chassis between two uprights separated by eighteen inches and securing said server chassis to said uprights by fasteners through said apertures into said uprights.

7. The computer of claim 3 further comprising:

said rear panel having an opening for a fan grating proximal to said fourth corner, and a vented opening next to said opening for a fan grating, and an opening for accessing a mother board and plurality of daughter boards;

said opening for accessing a mother board and plurality of daughter boards proximal to said third corner of said computer chassis; and said power supply chassis containing said power supply comprises:

said power supply chassis having a first side, a second side and a third side with an edge of said first side joined perpendicularly to an edge of said second side opposite said third side;

said third side positioned against said second side panel providing that a portion of heat generated inside said power supply is thermally conducted through said third side and said second side panel to said environment;

said first side having an opening;

said second side having a vented opening;

a third fan having an open grate and mounted in said power supply and arranged in operable combination with said opening in said first side and said opening for a fan grating in said rear panel to enable said third fan to generate an air stream circulating from an environment outsides said computer, through said vented opening in said rear panel, then across said mother board and daughter boards, then through said vented opening in said second side into said power supply, then through said opening in said first side, and through said open grate of said third fan, and through said opening in said rear panel proximal to said corner of said fourth corner of said server chassis into said environment.

8. The computer of claim 7 wherein said first side of said power supply has a length of 4½ inches.

9. The computer of claim 7 wherein said second side of said power supply has a length in a range from 6 to 12 inches.

10. The computer of claim 7 wherein said mother board has a card receptacle (51) arranged perpendicular to said rear panel and located between said vented opening and said power supply and said back panel comprises at least one slotted opening between said opening for a fan grating proximal to said fourth corner, and said opening for accessing said mother board adapted in operable combination with said opening for a fan grating and said opening for accessing said mother board to permit inserting said at least one card module through said slotted opening and plugging said at least one card module into said riser card.

11. An Internet having a plurality of interconnected server computers and client computers wherein at least one of said server computers comprises:

a computer chassis having a front panel, a first side panel, opposite a second side panel and a rear panel all mounted on a base panel to form a rectangular enclosure;

said front panel and said first side panel corner forming a first corner, said front panel and said second side corner forming a second corner, said rear panel and said first side panel forming a third corner, and said rear panel and said second side panel forming a fourth corner;

said first and second side panels being parallel to one another and separated by a space of seventeen inches;

said first and second side panels each joined perpendicularly to said front panel at a distance of one inch from respective ends of said front panel providing that a one inch length of said front panel extends beyond said first side panel and another one inch length of said front panel extends beyond said second side panel;

said one inch length and said another one inch length of said front panel extending beyond said first and second side panels respectively each having at least one aperture arranged to enable positioning said computer chassis between two uprights separated by eighteen inches and securing said seizer chassis to said uprights by fasteners through said apertures into said uprights;

said front panel having a first vented opening positioned proximal to said first corner, and a second vented opening proximal to said first vented opening and an opening for accessing a floppy disk drive;

said opening for accessing a floppy disk drive positioned between said second vented opening and said second corner;

said rear panel having an opening for a fan grating proximal to said fourth corner, and a vented opening and an opening for accessing a mother board and plurality of daughter boards;

said opening for accessing a mother board and plurality of daughter boards proximal to said third corner of said server chassis:

a first fan positioned next to said front panel and said first side panel and communicating with said first vented opening in said front panel:

a first hard disk drive positioned next to said first fan and said first side panel and arranged in operable combination with said first fan to enable said first fan to expel air heated by said first disk through said first vented opening to environment outside said server;

a second fan positioned next to said front panel and said first fan and communicating with said second vented opening in said front panel, a second hard disk drive positioned next to said second fan and said first hard disk drive and arranged in operable combination with said second fan to enable said second fan to expel air heated by said second hard disk drive through said second vented opening to outside said server:

a floppy disk drive positioned next to said second hard disk drive and said front panel adjacent said floppy disk opening arranged in operable combination with said floppy disk opening to provide access to said floppy disk drive through said floppy disk opening;

a power supply chassis containing a power supply and positioned in said fourth corner of said computer chassis;

said power supply chassis having a first side, a second side and a third side with an edge of said first side joined perpendicularly to an edge of said second side opposite said third side;

said third side positioned against said second side panel providing that a portion of heat generated inside said power supply is thermally conducted through said third side and said second side panel to said environment;

said first side of said power supply chassis having an opening;

said second side of said power supply chassis having a vented opening;

a third fan having an open grate and mounted in said power supply and arranged in operable combination with said opening in said first side of said power supply and said opening for a fan grating in said rear panel to enable said third fan to generate an air stream circulating from an environment outsides said server, through said vented opening in said rear panel, then across said mother board and daughter boards, then through said vented opening in said second side into said power supply, then through said opening in said first side, and through said open grate of said third fan, and through said opening in said rear panel proximal to said corner of said fourth corner of said computer chassis into said environment.

12. The Internet of claim 11 where said at least one server computer has an overall height of less than three and one half inches.

* * * * *